US009978970B2

(12) United States Patent
Lee et al.

(10) Patent No.: US 9,978,970 B2
(45) Date of Patent: May 22, 2018

(54) ORGANIC LIGHT EMITTING DEVICE

(71) Applicant: LG Display Co., Ltd., Seoul (KR)

(72) Inventors: JaeMan Lee, Seoul (KR); Taesun Yoo, Gyeonggi-do (KR); Mi-Young Han, Gyeonggi-do (KR); SoYeon Ahn, Seoul (KR); Heedong Choi, Gyeonggi-do (KR); JungSoo Park, Seoul (KR); Yoondeok Han, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 15/195,024

(22) Filed: Jun. 28, 2016

(65) Prior Publication Data
US 2017/0092887 A1    Mar. 30, 2017

(30) Foreign Application Priority Data

Sep. 30, 2015 (KR) ........................ 10-2015-0137554

(51) Int. Cl.
*H01L 27/32* (2006.01)
*H01L 51/54* (2006.01)
(Continued)

(52) U.S. Cl.
CPC ...... *H01L 51/5004* (2013.01); *H01L 27/3211* (2013.01); *H01L 51/5056* (2013.01);
(Continued)

(58) Field of Classification Search
CPC ..................... H01L 51/0004; H01L 27/3209
(Continued)

(56) References Cited

U.S. PATENT DOCUMENTS

2011/0133226 A1  6/2011  Lee et al.
2011/0133227 A1  6/2011  Lee et al.
(Continued)

FOREIGN PATENT DOCUMENTS

CN  102097455 A  6/2011
CN  102097456 A  6/2011
(Continued)

OTHER PUBLICATIONS

Extended European Search Report dated Mar. 2, 2017, for the corresponding European Patent Application No. 16180125.3.
(Continued)

*Primary Examiner* — George Fourson, III
(74) *Attorney, Agent, or Firm* — Morgan, Lewis & Bockius LLP

(57) ABSTRACT

An organic light emitting device including an organic light emitting element having a low driving voltage and a high luminous efficiency is provided. The organic light emitting device includes two or more stack emission units, and a charge generating layer including an N-type charge generating layer and a P-type charge generating layer is disposed between the stack emission units. Herein, the P-type charge generating layer is formed of a material having an LUMO energy level similar to an HOMO energy level of a hole transporting layer injected with holes from the P-type charge generating layer. Accordingly, even if the P-type charge generating layer is not additionally doped with a P-type dopant, it is possible to readily inject holes into a stack emission unit adjacent to the P-type charge generating layer.

16 Claims, 10 Drawing Sheets

(51) Int. Cl.
  *H01L 51/50* (2006.01)
  *H01L 51/52* (2006.01)
(52) U.S. Cl.
  CPC ...... *H01L 51/5072* (2013.01); *H01L 51/5088* (2013.01); *H01L 51/5271* (2013.01); *H01L 51/5278* (2013.01); *H01L 27/3209* (2013.01); *H01L 2251/552* (2013.01)
(58) Field of Classification Search
  USPC .......................................................... 257/89
  See application file for complete search history.

(56) References Cited

U.S. PATENT DOCUMENTS

| | | | |
|---|---|---|---|
| 2012/0098012 A1 | 4/2012 | Kim et al. | |
| 2012/0241726 A1* | 9/2012 | Kijima | H01L 51/5278 257/40 |
| 2013/0092909 A1 | 4/2013 | Han et al. | |
| 2013/0264551 A1* | 10/2013 | Pieh | H01L 51/5056 257/40 |
| 2013/0313535 A1* | 11/2013 | Heo | H01L 51/5064 257/40 |
| 2014/0124766 A1* | 5/2014 | Song | H01L 51/5004 257/40 |
| 2015/0155513 A1* | 6/2015 | Pieh | H01L 27/3209 257/40 |
| 2015/0188074 A1* | 7/2015 | Heo | H01L 51/5044 257/40 |
| 2016/0343776 A1* | 11/2016 | Heo | H01L 27/322 |
| 2017/0092870 A1* | 3/2017 | Kim | H01L 51/0052 |
| 2017/0155071 A1* | 6/2017 | Han | H01L 27/322 |
| 2017/0162792 A1* | 6/2017 | Kim | H01L 51/0052 |
| 2017/0309686 A1* | 10/2017 | Heo | H01L 27/322 |

FOREIGN PATENT DOCUMENTS

| | | |
|---|---|---|
| CN | 102456840 A | 5/2012 |
| CN | 103050633 A | 4/2013 |
| CN | 103811531 A | 5/2014 |
| EP | 2 330 654 A1 | 6/2011 |

OTHER PUBLICATIONS

First Notification of Office Action dated Oct. 16, 2017 from the State Intellectual Property Office of China in counterpart Chinese Application No. 201610527675.0.

\* cited by examiner

| HI-G | HT-G | HI-G LUMO−HT-G HOMO | electric light characteristic @ 10mA/m² | | | | | |
|---|---|---|---|---|---|---|---|---|
| | | | driving voltage (V) | | luminous efficiency (cd/A) | | external quantum efficiency (EQE, %) | |
| M-C | M-1 | +0.03 | 3.9 | ○ | 58.2 | ○ | 17.4 | ○ |
| | M-2 | +0.06 | 4.2 | ○ | 57.9 | ○ | 17.3 | ○ |
| | M-3 | +0.15 | 5.6 | X | 56.5 | △ | 16.9 | △ |
| | M-4 | +0.21 | 6.2 | X | 47.8 | X | 15.7 | X |
| M-B | M-1 | −0.08 | 4.0 | ○ | 56.9 | △ | 16.7 | △ |
| | M-2 | −0.05 | 3.9 | ○ | 57.9 | ○ | 17.1 | ○ |
| | M-3 | +0.04 | 4.1 | ○ | 56.1 | △ | 16.5 | △ |
| | M-4 | +0.1 | 4.3 | ○ | 57.7 | ○ | 17.5 | ○ |
| M-A | M-1 | +0.07 | 4.1 | ○ | 57.6 | ○ | 17.3 | ○ |
| | M-2 | +0.1 | 5.3 | ○ | 57.4 | ○ | 17.3 | ○ |
| | M-3 | +0.19 | 6.5 | X | 56.4 | △ | 17.0 | ○ |
| | M-4 | +0.25 | 6.6 | X | 55.4 | X | 16.6 | X |

FIG. 6

| HI-G | HT-G | HI-G LUMO-HT-G HOMO) | electric light characteristic @ 10mA/m² | | |
|---|---|---|---|---|---|
| | | | driving voltage (V) | luminous efficiency (cd/A) | external quantum efficiency (EQE, %) |
| M-A | M-1 | 0.07 | 3.6 | 8.0 | 9.0 |
| | M-4 | 0.25 | 5.8 | 5.2 | 4.0 |
| M-B | M-1 | 0.08 | 3.4 | 8.1 | 9.0 |
| | M-4 | 0.1 | 3.4 | 7.9 | 8.9 |

FIG. 7

| HI-G | HT-G | HI-G LUMO-HT-G HOMO) | electric light characteristic @ 10mA/m² | | |
|---|---|---|---|---|---|
| | | | driving voltage (V) | luminous efficiency (cd/A) | external quantum efficiency (EQE, %) |
| M-A | M-1 | 0.07 | 10.7 | 79.8 | 33.6 |
| | M-4 | 0.25 | 11.5 | 62.1 | 29.0 |
| M-B | M-4 | 0.08 | 10.6 | 80.0 | 33.7 |
| | M-4 | 0.08 | 11.1 | 84.1 | 34.8 |

FIG. 8

ORGANIC LIGHT EMITTING DEVICE

CROSS-REFERENCE TO RELATED APPLICATIONS

This application claims the priority of Korean Patent Application No. 10-2015-0137554 filed on Sep. 30, 2015, in the Korean Intellectual Property Office, the disclosure of which is incorporated herein by reference.

BACKGROUND

Field

The present disclosure relates to an organic light emitting device, and more particularly, to an organic light emitting device including an organic light emitting element which has a simple structure and thus can be easily manufactured, and also has improved color gamut, luminous efficiency, and lifetime.

Description of the Related Art

Recently, as the world entered the information age, the field of display for visually displaying electrical information signals has grown rapidly. Thus, various display devices that are thinner, more lightweight, and require low power consumption have been developed.

Specific examples of the display devices include a Liquid Crystal Display (LCD) device, a Plasma Display Panel (PDP) device, a Field Emission Display (FED) device, an Organic Light Emitting Device (OLED), and the like.

Particularly, the OLED is a display device using an organic light emitting element as a self-light emitting device. Further, the OLED has the advantages of high response speed, a high luminous efficiency, a high brightness, and a wide viewing angle as compared with the other display devices.

The organic light emitting element has a basic structure in which an organic emitting layer is disposed between two electrodes. Electrons and holes are injected into the organic emitting layer from the two electrodes, respectively, and the electrons and holes are combined into excitons in the organic emitting layer. When the generated excitons transition from an excited state to a ground state, light is emitted from the organic light emitting element.

An organic light emitting element may be a component in each the of sub-pixels respectively emitting red (R), green (G), and blue (B) lights. The sub-pixels each including the organic light emitting element constitute a pixel that realizes a full color gamut. Lights emitted from the red (R), green (G), and blue (B) sub-pixels have their own color coordinates respectively corresponding to red (R), green (G), and blue (B). A color gamut of the corresponding pixel can be expressed on the basis of the color coordinates respectively corresponding to red (R), green (G), and blue (B). Color coordinates are characteristic values of the light emitted from an organic light emitting element and thus determined depending on the material of an organic emitting layer. A color gamut of an organic light emitting element is an important factor in determining the excellence in image quality of an organic light emitting device (OLED). Further, a luminous efficiency of an organic light emitting element is an important factor in determining the excellence in lifetime of an OLED. Furthermore, a driving voltage of an organic light emitting element is an important factor in determining the excellence in power consumption of an OLED. In reaction to demands of the market for display devices having high image quality, long lifetime, and low power consumption, research and development for an organic light emitting element having a high color gamut and a high luminous efficiency with a low driving voltage continues to take place.

However, the organic light emitting element having a high color gamut and a high luminous efficiency may require a complicated structure. The complicated structure of the organic light emitting element means that its manufacturing process becomes complicated. As the complexity of the manufacturing process is increased, the yield of the OLED is decreased, which precludes any reduction in the production cost of the OLED. Further, a high-priced dopant material doped on an organic emitting layer also precludes any reduction in the production cost of the OLED.

SUMMARY

Accordingly, the present invention is directed to an organic light emitting device that substantially obviates one or more of the problems due to limitations and disadvantages of the related art.

An object of the present disclosure is to provide an OLED having a hole transporting layer disposed between a stack emission unit, which is not in direct contact with a first electrode but separated therefrom, and having a first electrode configured to have a relatively small thickness. Thus, an emitting layer disposed within the stack emission unit, which is not in direct contact with the first electrode but separated therefrom, has a high luminous efficiency.

Another object of the present disclosure is to provide an OLED including an organic light emitting element, wherein a hole transporting layer having a low hole mobility is disposed between a stack emission unit, which is not in direct contact with a first electrode but separated therefrom, and the first electrode. Thus, an emitting layer disposed within the stack emission unit, which is not in direct contact with the first electrode but separated therefrom, has a high luminous efficiency.

Yet another object of the present disclosure is to provide an OLED including an organic light emitting element, wherein the OLED has a more simple structure since a P-type charge generating layer included in an adjacent charge generating layer is not configured as a host-dopant system.

Still another object of the present disclosure is to provide an OLED including an organic light emitting element, wherein a P-type charge generating layer included in a charge generating layer has a low LUMO energy level, and, thus, holes are injected into a stack emission unit in an anionized and stable manner.

Still another object of the present disclosure is to provide an OLED including an organic light emitting element, wherein a high-priced dopant material is not used in a charge generating layer, and an energy level of the charge generating layer and an energy level of a hole transporting layer has an optimized relationship. Thus, the OLED has excellent electro-optical characteristics.

Still another object of the present disclosure is to provide an OLED including an organic light emitting element, wherein the OLED has a simple structure with excellent color gamut, luminous efficiency and driving voltage, and, thus, a manufacturing process is simplified. Therefore, the yield can be improved.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an OLED comprises a first stack emission unit including a first hole transporting layer, a first emitting layer, and a first electron transporting layer; a second stack emission unit including a second hole transporting layer, a second emitting layer, and a second electron transporting layer; and a first charge generating layer between the first stack emission unit and the second stack emission unit. Herein, the first charge generating layer includes an N-type charge generating layer configured to inject electrons into the first stack emission unit and a P-type charge generating layer configured to inject holes into the second stack emission unit. The P-type charge generating layer and the second hole transporting layer are in direct contact with each other. A difference between an LUMO energy level of the P-type charge generating layer and an HOMO energy level of the second hole transporting layer is smaller than a difference between an HOMO energy level of the P-type charge generating layer and the HOMO energy level of the second hole transporting layer.

In another aspect, an OLED comprises an organic light emitting element including at least two stack emission units each including a hole transporting layer, an emitting layer, and an electron transporting layer. At least one charge generating layer disposed between the at least two stack emission units includes an N-type charge generating layer and a P-type charge generating layer which is not doped with a dopant material. Herein, the P-type charge generating layer is configured to be anionized and thus injects holes into a stack emission unit adjacent to the P-type charge generating layer among the at least two stack emission units.

Details of exemplary embodiments of the present disclosure will be included in the detailed description of the disclosure and the accompanying drawings.

The effects of the present disclosure are not limited to the above-described effects. Although not described herein, other effects can be clearly understood by those skilled in the art from the following description.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 6 is a table showing evaluation results of electro-optical characteristics when a P-type charge generating layer candidate group and a hole transporting layer candidate group are applied to a yellow-green organic light emitting element including one stack emission unit;

FIG. 7 is a table showing evaluation results of electro-optical characteristics when a hole transporting layer candidate group and some of a P-type charge generating layer candidate group are applied to a blue organic light emitting element including one stack emission unit;

FIG. 8 is a table showing evaluation results of electro-optical characteristics when a hole transporting layer candidate group and some of a P-type charge generating layer candidate group are applied to a blue/yellow-green/blue organic light emitting element including three stack emission units;

DETAILED DESCRIPTION OF THE EMBODIMENTS

Figure 1:
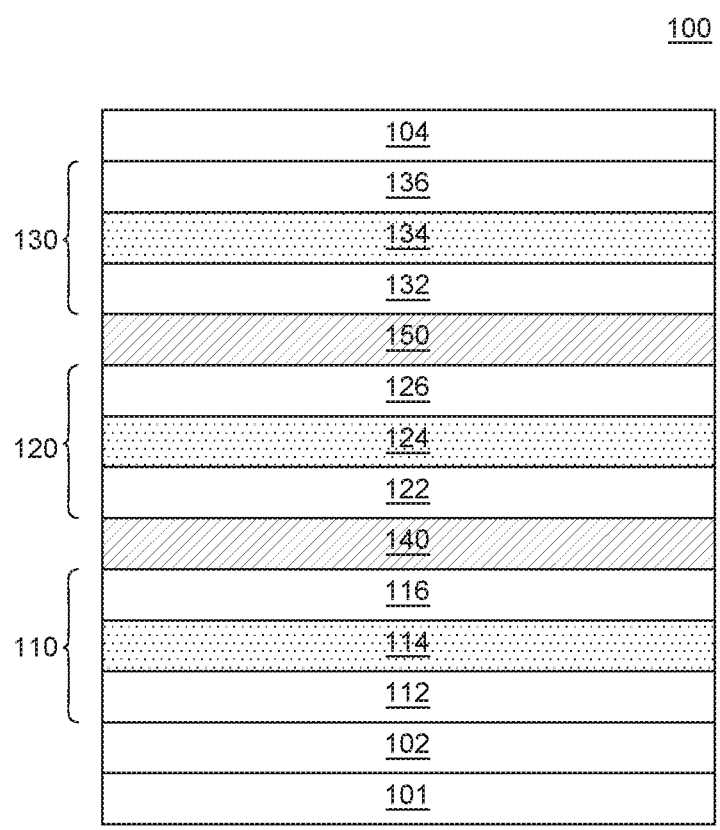
FIG. 1 through FIG. 3 are diagrams each illustrating a structure of an organic light emitting element according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete the description of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When a time sequence between two or more incidents is described using the terms such as "after", "subsequent to", "next to", and "before", two or more incidents may be inconsecutive unless the terms are used with the term "immediately" or "directly".

Although the terms "first", "second", and the like are used for describing various components, these components are not confined by these terms. These terms are merely used for distinguishing one component from the other components.

The features of various embodiments of the present disclosure can be partially or entirely joined or combined with each other and can be interlocked and operated in technically various ways, and the embodiments can be carried out independently of or in association with each other.

In the present specification, a Lowest Unoccupied Molecular Orbitals (LUMO) energy level and a Highest Occupied Molecular Orbitals (HOMO) energy level of a certain layer refer to an LUMO energy level and an HOMO energy level of a host material of the layer, respectively, unless being designated as LUMO energy level and HOMO energy level of a dopant material of the layer.

In the present specification, an electroluminescence (EL) spectrum can be calculated by multiplying a photoluminescence (PL) spectrum reflecting unique characteristics of a luminescent material by an emittance spectrum reflecting out coupling which varies depending on a thickness and optical characteristics of an organic layer such as an electron transporting layer. In the present specification, the EL spectrum means an EL spectrum measured from a front surface (i.e., at a viewing angle of 0°) of an organic light emitting element with respect to a light emitted from the organic light emitting element unless specifically indicated otherwise.

In the present specification, a stack emission unit refers to a unit structure including organic layers including an electron transporting layer and a hole transporting layer, and an organic emitting layer disposed between the electron transporting layer and the hole transporting layer. The organic layers may include an electron injecting layer, a hole injecting layer, a hole blocking layer, etc. constituting the stack emission unit. The stack emission unit may include other organic layers depending on a structure or design of an organic light emitting element.

Hereinafter, various exemplary embodiments of the present disclosure will be described in detail with reference to the accompanying drawings.

FIG. 1 is a diagram illustrating a structure of an organic light emitting element according to an exemplary embodiment of the present disclosure.

An organic light emitting element 100 in FIG. 1 includes a substrate 101, a first electrode 102, a second electrode 104, a first stack emission unit 110 between the first and second electrodes 102 and 104, a second stack emission unit 120, and a third stack emission unit 130.

The substrate 101 may be formed of an insulation material and/or a material having flexibility. The substrate 101 may be formed of glass, metal, plastic, or the like, but is not limited thereto. If an organic light emitting device (hereinafter, referred to as "OLED") is a flexible OLED, the substrate 101 may be formed of a flexible material such as ultrathin glass or plastic.

The first electrode 102 is an anode that supplies holes and may be formed of a transparent conductive material such as transparent conductive oxide (TCO) including indium tin oxide (ITO) and indium zinc oxide (IZO), but is not necessarily limited thereto.

The second electrode 104 is a cathode that supplies electrons and may be formed of a metallic material such as gold (Au), silver (Ag), aluminum (Al), molybdenum (Mo), magnesium (Mg), or alloys thereof, but is not necessarily limited thereto.

The first electrode 102 and the second electrode 104 may be referred to as an anode and a cathode, respectively. Otherwise, the first electrode 102 and the second electrode 104 may be a light transmissive electrode, a light reflective electrode, or a light transflective electrode.

The first stack emission unit 110 may include a first hole transporting layer (HTL) 112, a first emitting layer (EML) 114, and a first electron transporting layer (ETL) 116 on the first electrode 102. Such layers may be distinct (i.e. independent) or integrated (i.e. combined), and at least some functions of one layer could be alternatively implemented in a different layer, in which case, such different layer can serve a dual purpose.

The first EML 114 may be a blue EML configured to emit blue colored light.

The second stack emission layer 120 may include a second HTL 122, a second EML 124, and a second ETL 126. Such layers may be distinct (i.e. independent) or integrated (i.e. combined), and at least some functions of one layer could be alternatively implemented in a different layer, in which case, such different layer can serve a dual purpose.

The second EML 124 may be a yellow-green EML configured to emit yellow-green colored light.

A first charge generating layer (CGL) 140 may be further included between the first stack emission unit 110 and the second stack emission unit 120. The first CGL 140 regulates a charge balance between the first stack emission unit 110 and the second stack emission unit 120. The first CGL 140 may include an N-type CGL (N-CGL) and a P-type CGL (P-CGL). The N-CGL refers to a layer configured to inject electrons into the first stack emission unit 110 which is closer to the first electrode 102 than the second stack emission unit 120. The P-CGL refers to a layer configured to inject holes into the second stack emission unit 120 which is closer to the second electrode 104 than the first stack emission unit 110.

The third stack emission unit 130 may include a third HTL 132, a third EML 134, and a third ETL 136 on the second stack emission unit 120. Such layers may be distinct (i.e. independent) or integrated (i.e. combined), and at least some functions of one layer could be alternatively implemented in a different layer, in which case, such different layer can serve a dual purpose.

The third EML 134 may be a blue EML configured to emit blue colored light.

A second CGL 150 may be further included between the second stack emission unit 120 and the third stack emission unit 130. The second CGL 150 regulates a charge balance between the second stack emission unit 120 and the third stack emission unit 130. In the same manner as the first CGL 140, the second CGL 150 may include an N-CGL and a P-CGL.

Further, in an OLED including the organic light emitting element 100 according to an exemplary embodiment of the present disclosure, gate lines and data lines related to respective pixel areas are configured to intersect with each other, and power lines extended in parallel with any one of them are disposed on the substrate 101. In each pixel area, a switching thin film transistor (TFT) connected to a gate line and a data line and a driving TFT connected to the switching TFT are disposed. The driving TFT is connected to the first electrode 102.

Figure 2:
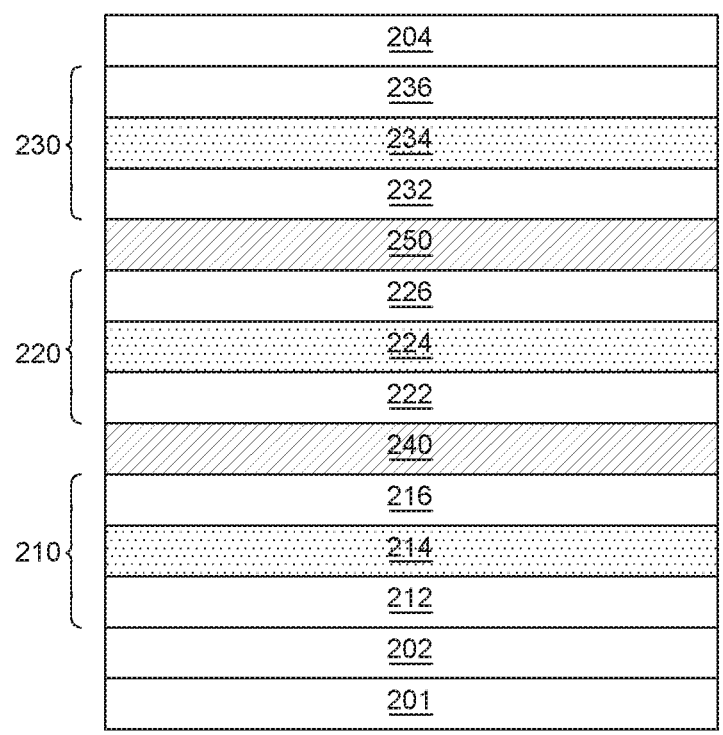

FIG. 2 is a diagram illustrating a structure of an organic light emitting element according to an exemplary embodiment of the present disclosure.

An organic light emitting element 200 in FIG. 2 includes a substrate 201, a first electrode 202, a second electrode 204, a first stack emission unit 210 between the first and second electrodes 202 and 204, a second stack emission unit 220, and a third stack emission unit 230.

The substrate 201 may be formed of an insulation material or a material having flexibility. The substrate 201 may be formed of glass, metal, plastic, or the like, but is not limited thereto. If an OLED is a flexible OLED, the substrate 201 may be formed of a flexible material such as ultrathin glass or plastic.

The first electrode 202 may be formed of a conductive material having a high work function. For example, the first electrode 202 may be formed of a transparent conductive material such as tin oxide (TO), indium tin oxide (ITO), indium zinc oxide (IZO), indium tin zinc oxide (ITZO), but is not necessarily limited thereto. In some exemplary embodiments, if the organic light emitting element 200 is applied to a top-emission OLED, the organic light emitting element 200 may include a reflective layer formed of highly reflective material such as silver (Ag) or an Ag alloy under the first electrode 202.

The second electrode 204 may be formed of a material having a low work function. For example, the second electrode 204 may be formed of a transparent conductive material such as transparent conductive oxide (TCO) including indium tin oxide (ITO), indium zinc oxide (IZO), and indium gallium zinc oxide (IGZO). Otherwise, the second electrode 204 may be formed of any one or more selected from the group consisting of opaque conductive metals such as magnesium (Mg), silver (Ag), aluminum (Al), calcium (Ca), and alloys thereof. For example, the second electrode 204 may be formed of alloy (Mg:Ag) of magnesium and silver. Alternatively, the second electrode 204 may include two layers respectively formed of transparent conductive oxide (TCO) such as indium tin oxide (ITO), indium zinc oxide (IZO), or indium gallium zinc oxide (IGZO) and a metallic material such as gold (Au), silver (Ag), aluminum (Al), molybdenum (Mo), and the like, but is not necessarily limited thereto.

The first electrode 202 and the second electrode 204 may be referred to as an anode and a cathode, respectively. Otherwise, the first electrode 202 and the second electrode 204 may be a light transmissive electrode, a light reflective electrode, or a light transflective electrode.

The first stack emission unit 210 may include a first HTL 212, a first EML 214, and a first ETL 216 on the first electrode 202. The first HTL 212 may include two or more layers. Otherwise, the first HTL 212 may be formed by using two or more materials. In order to readily inject holes into the first stack emission unit 210, a hole injecting layer (HIL) may be further provided under the first HTL 212 or such hole injecting functionality may be implemented into the first HTL 212. The first ETL 216 may include two or more layers. Otherwise, the first ETL 216 may be formed using two or more materials. In order to readily inject electrons into the first stack emission unit 210, an electron injecting layer (EIL) may be further provided on the first ETL 216.

The first HTL 212 supplies holes injected from the first electrode 202 or the HIL to the first EML 214. The first ETL 216 supplies electrons injected from a first CGL 240 to be described later or the EIL to the first EML 214. In the first EML 214, the holes supplied through the first HTL 212 and the electrons supplied through the first ETL 216 are recombined. When excitons generated by the recombination of the holes and electrons transition from an excited state to a ground state, light is generated.

A hole blocking layer (HBL) may be further provided on the first EML 214 or the first EML 214 may be configured to include such hole blocking functionality. The HBL suppresses a transfer of holes injected into the first EML 214 to the first ETL 216 so as to improve recombination between electrons and holes within the first EML 214. Since the electrons and the holes are recombined within the first EML 214, a luminous efficiency of the first EML 214 can be improved. If the HOMO energy level of the first ETL 216 is sufficiently low, the first ETL 216 can also function as the HBL. That is, the first ETL 216 and the HBL may be formed as one layer.

An electron blocking layer (EBL) may be further provided under the first EML 214. The EBL suppresses a transfer of electrons injected into the first EML 214 to the first HTL 212 so as to improve recombination between electrons and holes within the first EML 214. Since the electrons and the holes are recombined within the first EML 214, a luminous efficiency of the first EML 214 can be improved. If an LUMO energy level of the first HTL 212 is sufficiently low, the first HTL 212 can also function as the EBL. That is, the first HTL 212 and the EBL may be formed as one layer.

The first EML 214 may be configured to emit anyone of blue, deep blue, and sky blue colored light. The first EML 214 may have an emission wavelength range of from 440 nm to 480 nm.

The first EML 214 may include an auxiliary EML capable of emitting a light of another color except blue, deep blue, or sky blue. The auxiliary EML may include one of a yellow-green EML or a red EML, or a combination thereof. If the auxiliary EML is added to the first EML 214, a luminous efficiency of green or red light can be further improved. If the first EML 214 is configured to include the auxiliary EML, a yellow-green EML, a red EML, or a green EML may be disposed as the auxiliary EML on or under the first EML 214. Further, a yellow-green EML, a red EML, or a green EML may be disposed as the auxiliary EML on and under the first EML 214 in the same manner or different manners. A location or the number of emitting layers may be selected depending on a configuration or characteristics of the element, but is not necessarily limited thereto.

If the first EML 214 emits any one of blue, deep blue, and sky blue lights and includes an auxiliary EML capable of emitting a light of another color, the first EML 214 may have an emission wavelength range of from 440 nm to 650 nm.

The first EML 214 may be formed of at least one host material and at least one dopant material. For example, the first EML 214 may be formed of a mixed host material including two or more host materials and at least one dopant material. As the mixed host material, both a host material having a hole transporting property and a host material having an electron transporting property may be included in the first EML 214.

The first HTL 212, the first EML 214, the first ETL 216, the EIL, the HIL, the HBL, the EBL, and the like, constituting the first stack emission unit 210 may be organic layers formed of organic materials or doped with inorganic materials.

The first CGL 240 is provided on the first stack emission unit 210. That is, the first CGL 240 is provided between the first stack emission unit 210 and the second stack emission unit 220 to be described later. The first CGL 240 supplies charges to the first stack emission unit 210 and the second stack emission unit 220. The first CGL 240 regulates a charge balance between the first stack emission unit 210 and the second stack emission unit 220. The first CGL 240 may be formed as a plurality of layers including an N-CGL and a P-CGL, but is not limited thereto. The first CGL 240 may be formed as a single layer. The N-CGL refers to a layer configured to inject electrons into the first stack emission unit 210 which is closer to the first electrode 202 than the second stack emission unit. The P-CGL refers to a layer configured to inject holes into the second stack emission unit 220 which is closer to the second electrode 204 than the first stack emission unit 210.

The N-CGL injects electrons into the first stack emission unit 210.

The N-CGL is configured as a host-dopant system and thus may include an N-type dopant material and an N-type host material. The N-type dopant material may include metals of Group I and Group II of the periodic table, organic materials to which electrons can be injected, or mixtures thereof. For example, the N-type dopant material may be any one of alkali metals and alkali earth metals. That is, the N-CGL 131 may be an organic layer doped with an alkali metal such as lithium (Li), sodium (Na), potassium (K) or cesium (Cs), or an alkali earth metal such as magnesium (Mg), strontium (Sr), barium (Ba) or radium (Ra), but is not limited thereto. The N-type host material may be formed of materials capable of transferring electrons, for example, Alq3(tris(8-hydroxyquinolino)aluminum), Liq(8-hydroxyquinolinolato-lithium), PBD(2-(4-biphenylyl)-5-(4-tert-butylphenyl)-1,3,4oxadiazole), TAZ(3-(4-biphenyl) 4-phenyl-5-tert-butylphenyl-1,2,4-triazole), spiro-PBD, and any one or more materials selected from the group consisting of BAlq(bis(2-methyl-8-quinolinolate)-4-(phenylphenolato) aluminium), SAlq, TPBi(2,2',2-(1,3,5-benzinetriyl)-tris(1-phenyl-1-H-benzimidazole), oxadiazole, triazole, phenanthroline, benzoxazole, or benzthiazole, but is not limited thereto.

Otherwise, the N-CGL may not be configured as a host-dopant system. That is, the N-CGL may not include an N-type dopant material.

The P-CGL injects holes into the second stack emission unit 220.

The P-CGL may include a P-type dopant material and a P-type host material. The P-CGL has a structure disposed on the N-CGL and bonded to the N-CGL. The P-type dopant material may include metal oxide, organic materials such as tetrafluoro-tetracyanoquinodimethane (F4-TCNQ), hexaazatriphenylene-hexacarbonitrile (HAT-CN), and hexaazatriphenylene, or metal materials such as $V_2O_5$, $MoO_x$, and $WO_3$, but is not necessarily limited thereto. The P-type host material may be formed of a material capable of transferring holes, for example, any one or more selected from the group consisting of NPD (N,N-dinaphthyl-N,N'-diphenylbenzidine)(N,N'-bis(naphthalene-1-yl)-N,N'-bis (phenyl)-2,2'-dimethylbenzidine), TPD (N,N'-bis-(3-methylphenyl)-N,N'-bis-(phenyl)-benzidine), and MT DATA (4,4',4-Tris(N-3-methylphenyl-N-phenyl-amino)-triphenylamine), but is not necessarily limited thereto.

Otherwise, the P-CGL may not be configured as a host-dopant system. That is, the P-CGL included in the organic light emitting element 200 according to an exemplary embodiment of the present disclosure may not use a P-type dopant material. Since the dopant material is not used, a production cost of the organic light emitting element can be reduced. As a result, it is not necessary to perform a doping process. Thus, a manufacturing process of the organic light emitting element can be simplified. Also, it is possible to manufacture the organic light emitting element having the performance equivalent or superior to that of an organic light emitting element employing a P-CGL configured as a host-dopant system. Details thereof will be described with reference to FIG. 5 through FIG. 11.

The second stack emission unit 220 is provided on the first CGL 240. The second stack emission unit 220 may include a second HTL 222, a second EML 224, and a second ETL 226. The second HTL 222 may include two or more layers.

The second HTL 222 may be formed of using two or more materials. In order to readily inject holes into the second stack emission unit 220, an HIL may be further provided under the second HTL 222. The second ETL 226 may include two or more layers. Otherwise, the second ETL 226 may be formed using two or more materials. In order to readily inject electrons into the second stack emission unit 220, an EIL may be further provided on the second ETL 226.

The second HTL 222 supplies holes injected from the first CGL 240 or the HIL to the second EML 224. The second ETL 226 supplies electrons injected from a second CGL 250 to be described later or the EIL to the second EML 224. In the second EML 224, the holes supplied through the second HTL 222 and the electrons supplied through the second ETL 226 are recombined. When excitons generated by the recombination of the holes and electrons transition from an excited state to a ground state, lights are generated.

An HBL may be further provided on the second EML 224. The HBL suppresses a transfer of holes injected into the second EML 224 to the second ETL 226 so as to improve recombination between electrons and holes within the second EML 224. Since the electrons and the holes are recombined within the second EML 224, a luminous efficiency of the second EML 224 can be improved. If the HOMO energy level of the second ETL 226 is sufficiently low, the second ETL 226 can also function as the HBL. That is, the second ETL 226 and the HBL may be formed as one layer.

An EBL may be further provided under the second EML 224. The EBL suppresses a transfer of electrons injected into the second EML 224 to the second HTL 222 so as to improve recombination between electrons and holes within the second EML 224. Since the electrons and the holes are recombined within the second EML 224, a luminous efficiency of the second EML 224 can be improved. If the LUMO energy level of the second HTL 222 is sufficiently high, the second HTL 222 can also function as the EBL. That is, the second HTL 222 and the EBL may be formed as one layer.

The second EML 224 may emit any one of yellow-green and green lights. The second EML 224 may have an emission wavelength range of from 510 nm to 590 nm. The second EML 224 may emit a color light having a particularly high visibility compared with other color lights among visible lights. A yellow-green or green light has a higher visibility to a user than red and blue lights. That is, the second EML 224 may emit a yellow-green or green light.

For example, the second EML 224 and a third EML 234 may emit a yellow-green light and a blue light, respectively. In this case, even if an energy level of the P-CGL and an energy level of a third HTL 322 are optimized, a luminous efficiency of the third EML 234 is improved. Likewise, even if the energy level of the P-CGL and an energy level of the second HTL 222 are optimized, a luminous efficiency of the second EML 224 is improved. However, an overlap with a user visibility curve more often occurs in the yellow-green light than in the blue light. Therefore, the improvement in luminous efficiency of the second EML is greater than that of the third EML 234.

The second EML 224 may include an auxiliary EML capable of emitting a light of another color except yellow-green or green. The auxiliary EML may be a red EML. If the auxiliary EML is added to the first EML 214, a luminous efficiency of red light can be further improved. If the second EML 224 is configured to include the auxiliary EML, a red EML may be disposed as the auxiliary EML on or under the second EML 224. Further, a red EML may be disposed as the auxiliary EML on and under the second EML 224 in the same manner or different manners. A location or the number of emitting layers may be selected depending on a configuration or characteristics of the element, but is not necessarily limited thereto.

If the second EML 224 emits any one of yellow-green and green lights and includes an auxiliary EML capable of emitting a red light, the second EML 224 may have an emission wavelength range of from 510 nm to 650 nm.

If the second EML 224 may be formed of at least one host material and at least one dopant material. For example, the second EML 224 may be formed of a mixed host material including two or more host materials and at least one dopant material. As the mixed host material, both a host material having a hole transporting property and a host material having an electron transporting property may be included in the second EML 224.

The second HTL 222, the second EML 224, the second ETL 226, the EIL, the HIL, the HBL, the EBL, and the like, constituting the second stack emission unit 220 may be organic layers formed of organic materials or doped with inorganic materials.

In order to improve the luminous efficiency of the second EML 224, the second stack emission unit 220 may be disposed as close as possible to the first electrode 202. In order to dispose the second EML 224 close to the first electrode 202, thicknesses of the first HTL 212 and the second HTL 222 may be adjusted. However, there is a limitation in reducing the thickness of the first HTL 212 considering a cavity peak of the light emitted from the first EML 214. Due to such a limitation, the sum of thicknesses of the organic layers between the first EML 212 and the second EML 224 may be greater than the sum of thicknesses of the organic layers between the first electrode 202 and the first EML 212. Therefore, the thickness of the second HTL 222 between the first EML 212 and the second EML 224 may be adjusted so as to dispose the second EML 224 close to the first electrode 202. For example, considering a cavity peak of the second stack emission unit 220, the thickness of the second HTL 222 may be adjusted to 10 nm or less and the thickness of the first HTL 212 may be adjusted to from 90 nm to 110 nm. That is, when the thicknesses of the first HTL 212 and the second HTL 222 are adjusted, the thickness of the second HTL 222 may be smaller than the thickness of the first HTL 212. Thus, the luminous efficiency of the second EML 224 can be improved.

Since the second HTL 222 has a smaller thickness, holes may pass by the second EML 224 and may be transferred to the second ETL 226. That is, since the second HTL 222 has a smaller thickness, there may be an increase in number of holes which are not involved in generation of excitons in the second EML 224 but continuously moved. If holes pass by the second EML 224, the holes cannot be involved in recombination for emission. Therefore, there is a loss of the luminous efficiency. In order to reduce such a loss, the second HTL is formed of a material having a low hole mobility. Further, a movement speed of holes is regulated in order for the holes to slowly move in a thin section of the second HTL 222. For example, the second HTL 222 and the first HTL 212 may be formed of materials each having a different hole mobility, and at least the second HTL 222 may be formed of a material having a lower hole mobility than the first HTL 212.

That is, in order to improve efficiency of the organic light emitting element, the second HTL 222 may have a smaller thickness than at least the first HTL 212 such that the second EML 224 is disposed close to the first electrode 202. Further, the second HTL 222 may be formed of a material having a low hole mobility such that holes do not pass by the second EML 224.

Therefore, the second HTL 222 may be referred to as a hole regulating layer. The hole regulating layer regulates a movement of holes to the second EML 224. Due to the hole regulating layer, a recombination area of electrons and holes in the second stack emission unit 220 can be present in the second EML 224 rather than in the second ETL 226 or an interface between the second EML 224 and the second ETL 226.

The second HTL 222 may include a material having a low hole mobility. In this case, a hole transporting material of the second HTL 222 may be formed of a compound including a substituent having an electron transporting property rather than a substituent having a hole transporting property with respect to a core of the hole transporting material. The compound including a substituent having an electron transporting property may be any one of, for example, pyridine-based, triazine-based, imidazole-based, benzimidazole-based, quinolone-based, trizole-based, and phenanthroline-based compounds, but is not limited thereto.

Specifically, for example, the second HTL 222 may be formed of PY1(3,5-di(pyren-1-yl)pyridine, TmPPPyTz(2,4,6-tris(3'-(pyridine-3-yl) biphenyl-3-yl)-1,3,5-triazine), TPBi (2,2',2"-(1,3,5-benzinetriyl)-tris(1-phenyl-1-H-benzimidazole), TAZ(3-(4-biphenyl)-4-phenyl-5-tert-butylphenyl-1,2,4-triazole), BPhen(4,7-diphenyl-1,10-phenanthroline), and the like, but is not necessarily limited thereto.

The first HTL 212 may be formed of, for example, NPD (N,N'-bis(naphthalene-1-yl)-N,N'-bis(phenyl)-2,2'-dimethyl benzidine).

Further, the first HTL 212 may have a hole mobility of from $5.0 \times 10^{-5}$ cm$^2$/Vs to $9.0 \times 10^{-4}$ cm$^2$/Vs. A hole mobility of the second HTL 222 may have a half-order difference from the hole mobility of the first HTL 212. Therefore, the second HTL 222 may have the hole mobility of from $5.0 \times 10^{-6}$ cm$^2$/Vs to $9.0 \times 10^{-5}$ cm$^2$/Vs.

If the hole mobility of the second HTL 222 is low, the second ETL 226 may be formed of a material having a high electron mobility in order to regulate a charge balance of the second EML 224. The second ETL 226 may have an electron mobility of $1.0 \times 10^{-3}$ cm$^2$/Vs or more.

For example, the second ETL 226 may be formed of any one or more of PBD (2-(4-biphenyl)-5-(4-tert-butylphenyl)-1,3,4-oxadiazole), BAlq (Bis(2-methyl-8-quinolinolate)-4-(phenylphenolato)aluminium), and Liq (8-hydroxyquinolinato-lithium), but is not limited thereto.

The second ETL 226 may be formed of, for example, Alq3 (tris(8-hydroxy-quinolinato)aluminum), but is not limited thereto.

Further, the second ETL 226 may have an electron mobility of $1.0 \times 10^{-5}$ cm$^2$/Vs or more.

A charge balance of the second EML 224 can be regulated by the second ETL 226 having a high electron mobility and the second HTL 222 having a low hole mobility. If the second EML 224 has a charge balance, a recombination area of holes and electrons is present within the second EML 224. Therefore, the luminous efficiency of the second EML 224 can be improved.

That is, if the organic light emitting element includes two or more stack emission units, a HTL having a low hole mobility is included in any one of the stack emission units. For example, the stack emission unit including the HTL having a low hole mobility may include a yellow-green EML or a green EML. That is, the HTL having a low hole mobility may be included in the stack emission unit including the yellow-green EML or the green EML in order to improve luminous efficiency of the yellow-green EML or the green EML. Herein, the stack emission unit including the yellow-green EML or the green EML may be the second stack emission unit 220. Further, in the second stack emission unit including the yellow-green EML or the green EML, the HTL having a low hole mobility may be the second HTL 222.

Otherwise, if the organic light emitting element includes two or more stack emission units, a HTL having a low hole mobility is included in any one of the stack emission units. For example, the stack emission unit including the HTL having a low hole mobility may be a stack emission unit disposed to be separated from the first electrode rather than a stack emission unit indirect contact with the first electrode. That is, the EML having a low hole mobility may be included in the stack emission unit, which is not disposed in direct contact with the first electrode, in order to improve luminous efficiency of an EML included in the stack emission unit. Herein, the stack emission unit which is not disposed in direct contact with the first electrode may be the second stack emission unit 220. Further, in the stack emission unit disposed to be separated from the first electrode, the HTL having a low hole mobility may be the second HTL 222.

Further, the second ETL 226 may have a structure in which two or more layers are laminated, and may be formed of two or more materials.

As described above, the P-CGL may include a P-type dopant material and a P-type host material. Otherwise, the P-CGL may not be configured as a host-dopant system. That is, the P-CGL included in the organic light emitting element according to an exemplary embodiment of the present disclosure may not use a P-type dopant material.

If the P-CGL is not configured as a host-dopant system, an energy level of the P-CGL and an energy level of the second HTL 222 need to be optimized considering luminous efficiency of the second EML 224. If the P-CGL is disposed in direct contact with the second HTL 222, an interface is formed between the P-CGL and the second HTL 222. A movement method of holes from the P-CGL to the second HTL 222 may include: (1) a movement method of holes from the P-CGL to the second HTL 222 according to an HOMO energy level; and (2) a movement method of electrons from the second HTL 222 to the P-CGL according to an LUMO energy level.

If an HOMO energy level of the P-CGL is similar to an HOMO energy level of the second HTL 222, the method (1) may be realized. In this case, the P-CGL includes a material which is stabilized by cationization. For example, the P-CGL may include an aromatic amine-based material.

Meanwhile, if the LUMO energy level of the P-CGL is similar to the HOMO energy level of the second HTL 222, the method (2) may be realized. For example, a difference between the LUMO energy level of the P-CGL and the HOMO energy level of the second HTL 222 may be smaller than a difference between the HOMO energy level of the P-CGL and the HOMO energy level of the second HTL 222. Herein, the term "small difference" means a small difference in absolute value between comparison targets. In this case, the P-CGL includes a material which is stabilized by anionization. For example, the P-CGL may include an HAT-CN-based material, but is not limited thereto.

The organic light emitting element 200 according to an exemplary embodiment of the present disclosure follows the method (2) as the movement method of holes from the P-CGL to the second HTL 222. The organic light emitting element 200 according to an exemplary embodiment of the present disclosure has an optimized correlation between the LUMO energy level of the P-CGL and the HOMO energy level of the second HTL 222. Thus, it is possible to readily inject holes from the P-CGL into the second stack emission unit 220. Therefore, a luminous efficiency of the second stack emission unit 220 can be improved.

Hereinafter, a correlation between the LUMO energy level of the P-CGL and the HOMO energy level of the second HTL 222 will be described in detail with reference to FIG. 5 through FIG. 11.

If the HIL is further provided under the second HTL 222, the P-CGL may be disposed in direct contact with the HIL. If an interface is formed between the P-CGL and the HIL, the correlation between the LUMO energy level of the P-CGL and the HOMO energy level of the second HTL 222 to be described with reference to FIG. 5 through FIG. 11 can be applied. That is, the correlation between the LUMO energy level of the P-CGL and the HOMO energy level of the second HTL 222 to be described with reference to FIG. 5 through FIG. 11 can be applied to a correlation between the LUMO energy level of the P-CGL and an HOMO energy level of the HIL.

Further, the correlation between the LUMO energy level of the P-CGL and the HOMO energy level of the second HTL 222 with reference to FIG. 5 through FIG. 11 is just an illustrative example. However, it is not limited to a relationship between the second stack emission unit 220 and the P-CGL adjacent to the second stack emission unit 220. Therefore, it can be applied to a correlation between the LUMO energy level of the P-CGL and an HOMO energy level of a third HTL 232 and a correlation between an LUMO energy level of the P-CGL and an HOMO energy level of the second HTL 322 illustrated in FIG. 3.

Figure 5:
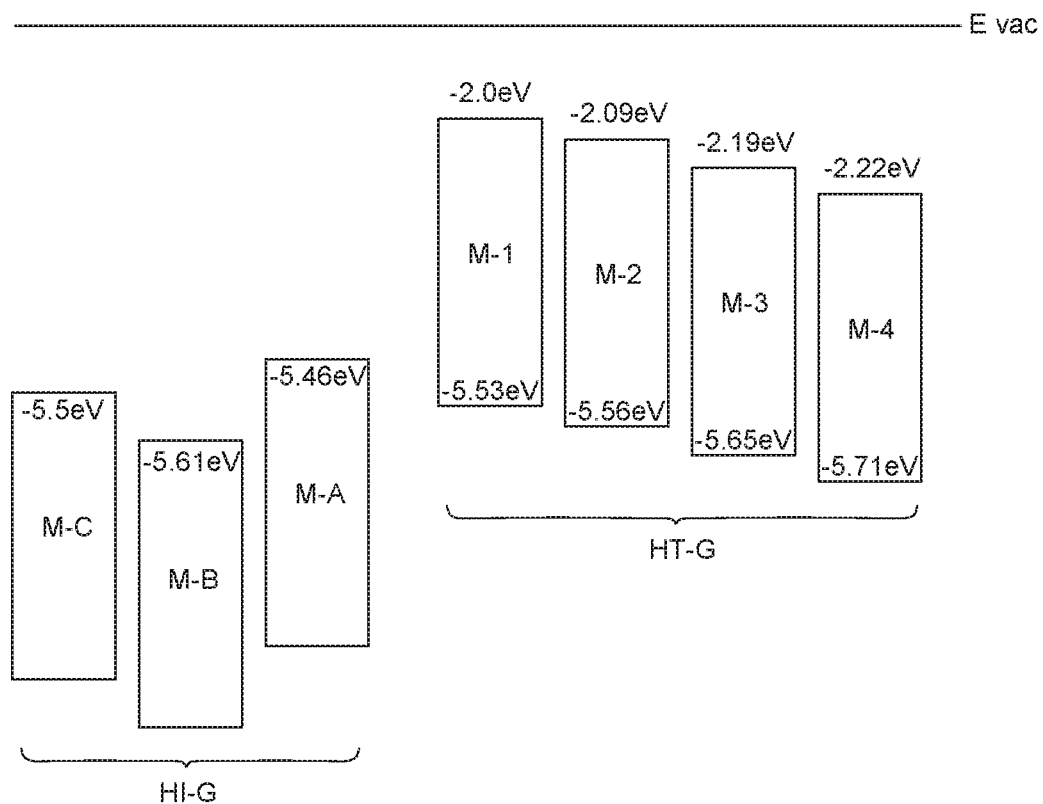
FIG. 5 is a diagram illustrating LUMO energy levels of a P-type charge generating layer candidate group, and LUMO and HOMO energy levels of a hole transporting layer candidate group.

FIG. 5 is a diagram illustrating LUMO energy levels of an exemplary P-CGL, and the LUMO and HOMO energy levels of an exemplary HTL.

The exemplary P-CGL HI-G includes a material A (M-A), a material B (M-B), and a material C (M-C). The material A (M-A) has an LUMO energy level of −5.46 eV. The material B (M-B) has an LUMO energy level of −5.61 eV. The material C (M-C) has an LUMO energy level of −5.5 eV.

Meanwhile, the exemplary HTL HT-G includes a first material (M-1), a second material (M-2), a third material (M-3), and a fourth material (M-4). The first material (M-1) has the LUMO energy level of −2.0 eV and the HOMO energy level of −5.53 eV. The second material (M-2) has the LUMO energy level of −2.09 eV and the HOMO energy level of −5.56 eV. The third material (M-3) has the LUMO energy level of −2.19 eV and the HOMO energy level of −5.65 eV. The fourth material has the LUMO energy level of −2.22 eV and the HOMO energy level of −5.71 eV.

Referring to FIG. 6, a correlation of a difference between the LUMO energy level of a P-CGL and the HOMO energy level of an HTL in a yellow-green organic light emitting element with electro-optical characteristics will be described.

FIG. 6 is a table showing evaluation results of electro-optical characteristics when an exemplary P-CGL HI-G and an exemplary HTL HT-G are applied to a yellow-green organic light emitting element including one stack emission unit.

FIG. 6 illustrates electro-optical characteristics (@10 mA/m$^2$) of 12 organic light emitting elements manufactured by combining various examples illustrated in FIG. 5. The 12 organic light emitting elements are yellow-green organic light emitting elements in which a P-CGL and a yellow-green stack emission unit are disposed in sequence between a first electrode and a second electrode. Herein, the P-CGL is not configured as a host-dopant system. That is, the P-CGL is formed as a non-doped organic layer.

In FIG. 6, the electro-optical characteristics of the 12 organic light emitting elements are compared with reference electro-optical. A case where there is an improvement in performance compared with Comparative Example is indicated by O. Further, a case where there is a decrease in performance which can be overcome by regulating other components is indicated by Δ. Furthermore, an inapplicable case where there is a decrease in performance which cannot be overcome even by regulating other components is indicated by x.

Comparative Example is a yellow-green organic light emitting element in which a P-CGL and a yellow-green stack emission unit are disposed in sequence between a first electrode and a second electrode. Herein, the P-CGL is configured as a host-dopant system. That is, the P-CGL is formed as an organic layer doped with a P-type dopant. The reference electro-optical characteristics are as follows: a driving voltage of from 3.9 V to 4.1 V, a luminous efficiency of from 57 cd/A to 60 cd/A, an external quantum efficiency of from 17.2% to 17.6%.

Referring to FIG. 6, an organic light emitting element (hereinafter, referred to as "C-3 combination element") manufactured by disposing the material C (M-C) in a P-CGL and the third material (M-3) in an HTL has a difference of +0.15 eV between the LUMO energy level of the material C (M-C) and the HOMO energy level of the third material (M-3). The C-3 combination element has a much higher driving voltage than an organic light emitting element having a difference of less than ±0.15 eV (i.e., a difference of less than 0.15 eV in absolute value) between the LUMO energy level of a P-CGL and the HOMO energy level of an HTL among the 12 organic light emitting elements.

Further, an organic light emitting element (hereinafter, referred to as "C-4 combination element") manufactured by disposing the material C (M-C) in a P-CGL and the fourth material (M-4) in an HTL has a difference of +0.21 eV between the LUMO energy level of the material C (M-C) and the HOMO energy level of the fourth material (M-4). The C-4 combination element has a much higher driving voltage than an organic light emitting element having a difference of less than ±0.15 eV between the LUMO energy level of a P-CGL and the HOMO energy level of an HTL among the 12 organic light emitting elements.

Further, an organic light emitting element (hereinafter, referred to as "A-3 combination element") manufactured by disposing the material A (M-A) in a P-CGL and the third material (M-3) in an HTL has a difference of +0.19 eV between the LUMO energy level of the material A (M-A) and the HOMO energy level of the third material (M-3). The A-3 combination element has a much higher driving voltage than an organic light emitting element having a difference of less than ±0.15 eV between the LUMO energy level of a P-CGL and an HOMO energy level of the HTL.

Furthermore, an organic light emitting element (hereinafter, referred to as "A-4 combination element") manufactured by disposing the material A (M-A) in a P-CGL and the fourth material (M-4) in an HTL has a difference of +0.25 eV between the LUMO energy level of the material A (M-A) and the HOMO energy level of the fourth material (M-4). The A-4 combination element has a much higher driving voltage than an organic light emitting element having a difference of less than ±0.15 eV between the LUMO energy level of a P-CGL and the HOMO energy level of an HTL.

Accordingly, it can be seen that regardless of which of the LUMO energy level of a P-CGL and the HOMO energy level of an HTL is high or low, as a difference between the LUMO energy level of the P-CGL and the HOMO energy level of the HTL is increased, a driving voltage is increased and a luminous efficiency is decreased.

Particularly, it can be seen that if a difference between the LUMO energy level of the P-CGL and the HOMO energy level of the HTL is ±0.15 eV or more, a driving voltage of the organic light emitting element is increased sharply and a luminous efficiency is decreased sharply.

Referring to FIG. 7, a correlation of a difference between the LUMO energy level of a P-CGL and the HOMO energy level of an HTL in a blue organic light emitting element with electro-optical characteristics will be described.

FIG. 7 is a table showing evaluation results of electro-optical characteristics when an exemplary P-CGL HI-G and an exemplary HTL HT-G are applied to a blue organic light emitting element including one stack emission unit.

FIG. 7 illustrates electro-optical characteristics (@10 mA/m$^2$) of 4 organic light emitting elements manufactured by combining various candidate materials shown in FIG. 5. The 4 organic light emitting elements are blue organic light emitting elements in which a P-CGL and a blue stack emission unit are disposed in sequence between a first electrode and a second electrode. Herein, the P-CGL is not configured as a host-dopant system. That is, the P-CGL is formed as a non-doped organic layer.

Referring to FIG. 7, evaluation results of electro-optical characteristics of a blue organic light emitting element (A-1 combination element) employing a combination having a smallest difference between the LUMO energy level of a P-CGL and the HOMO energy level of an HTL and a blue organic light emitting element (A-4 combination element) employing a combination having a greatest difference are compared.

The A-1 combination element has a difference of +0.07 eV between the LUMO energy level of the material A (M-A) and the HOMO energy level of the first material (M-1). The A-1 combination element has a driving voltage 3.6 V, a luminous efficiency of 8.0 cd/A, and an external quantum efficiency of 9.0% at 10 mA/m$^2$.

The A-4 combination element has a difference of +0.25 eV between the LUMO energy level of the material A (M-A) and the HOMO energy level of the fourth material (M-4). The A-4 combination element has a driving voltage 5.8 V, a luminous efficiency of 5.2 cd/A, and an external quantum efficiency of 4.0% at 10 mA/m$^2$. The general electro-optical characteristics of the A-4 combination element are very low. Particularly, the external quantum efficiency of the A-4 combination element is lower by about 50% than that of the A-1 combination element.

As described above, FIG. 7 confirms that as a difference between the LUMO energy level of a P-CGL and the HOMO energy level of an HTL is increased, a driving voltage is increased and a luminous efficiency is decreased.

Meanwhile, referring to FIG. 7, there will be described an evaluation result of electro-optical characteristics of a B-1 combination element employing the first material (M-1) as an HTL in the same manner as the A-1 combination element but employing the material B (M-B) as a P-CGL unlike the A-1 combination element. A difference between the LUMO energy level of the material B (M-B) and the HOMO energy level of the first material (M-1) is +0.08 eV. The B-1 combination element has a driving voltage of 3.4 V, a luminous efficiency of 8.1 cd/A, and an external quantum efficiency of 9.0% at 10 mA/m$^2$.

Further, referring to FIG. 7, there will be described an evaluation result of electro-optical characteristics of a B-4 combination element employing the fourth material (M-4) as an HTL in the same manner as the A-4 combination element but employing the material B (M-B) as a P-CGL unlike the A-4 combination element. A difference between the LUMO energy level of the material B (M-B) and the HOMO energy level of the fourth material (M-4) is +0.1 eV. The B-4 combination element has a driving voltage of 3.4 V, a luminous efficiency of 7.9 cd/A, and an external quantum efficiency of 8.9% at 10 mA/m$^2$. Similar to the B-1 combination element and the A-4 combination element, the general electro-optical characteristics of the B-4 combination element are high.

Accordingly, it is confirmed that electro-optical characteristics of an organic light emitting element is related to a correlation between the LUMO energy level of a P-CGL and the HOMO energy level of an HTL rather than a material for transporting holes.

As described above, FIG. 7 confirms that as a difference between the LUMO energy level of a P-CGL and the HOMO energy level of an HTL is increased, a driving voltage is increased and a luminous efficiency is decreased.

Referring to FIG. 8, a correlation of a difference between the LUMO energy level of a P-CGL and the HOMO energy level of an HTL in a white organic light emitting element including two or more (for example, three) stack emission units with electro-optical characteristics will be described.

FIG. 8 is a table showing evaluation results of electro-optical characteristics when a P-CGL candidate group HI-G and a HTL candidate group HT-G are applied to a blue/yellow-green/blue organic light emitting element including three stack emission units.

FIG. 8 illustrates electro-optical characteristics (@10 mA/m$^2$) of 4 organic light emitting elements manufactured by combining various candidate materials shown in FIG. 5. The 4 organic light emitting elements are blue/yellow-green/blue organic light emitting elements including a first electrode, a blue stack emission unit on the first electrode, a first CGL on the blue stack emission unit, a yellow-green stack emission unit on the first CGL, a second CGL on the yellow-green stack emission unit, a blue stack emission unit on the second CGL, and a second electrode on the blue stack emission unit. A P-CGL included in the second CGL is configured as a host-dopant system, whereas a P-CGL included in the first CGL is not configured as a host-dopant system. That is, the P-CGLs are formed as non-doped organic layers.

Referring to FIG. 8, an A-1 combination element has a difference of +0.07 eV between the LUMO energy level of the material A (M-A) and the HOMO energy level of the first material (M-1). The A-1 combination element has a driving voltage 10.7 V, a luminous efficiency of 79.8 cd/A, and an external quantum efficiency of 33.6% at 10 mA/m$^2$.

Further, an A-4 combination element has a difference of +0.25 eV between the LUMO energy level of the material A (M-A) and the HOMO energy level of the fourth material (M-4). The A-4 combination element has a driving voltage 11.5 V, a luminous efficiency of 62.1 cd/A, and an external quantum efficiency of 29.0% at 10 mA/m$^2$. The general electro-optical characteristics of the A-4 combination element are very low. Particularly, the luminous efficiency of the A-4 combination element is lower by about 23% than that of the A-1 combination element.

Further, a B-4 combination element has a difference of +0.08 eV between the LUMO energy level of the material B (M-B) and the HOMO energy level of the fourth material (M-4). The B-4 combination element has a driving voltage of 10.6 V (11.1 V in another sample of the same kind), a luminous efficiency of 80.0 cd/A (84.1 cd/A in another sample of the same kind), and an external quantum efficiency of 33.7% (34.8% in another sample of the same kind) at 10 mA/m$^2$. That is, similar to the B-1 combination element and the A-4 combination element, the general electro-optical characteristics of the B-4 combination element are high.

Accordingly, it is confirmed that electro-optical characteristics of an organic light emitting element is related to a correlation between the LUMO energy level of a P-CGL and the HOMO energy level of an HTL rather than a material for transporting holes.

As described above, FIG. 8 confirms that as a difference between the LUMO energy level of a P-CGL and the HOMO energy level of an HTL is increased, a driving voltage is increased and a luminous efficiency is decreased.

The evaluation results of electro-optical characteristics of the A-1 combination element and the A-4 combination element shown in FIG. 8 will be compared in more detail as follows with reference to FIG. 9 through FIG. 11.

Figure 9:
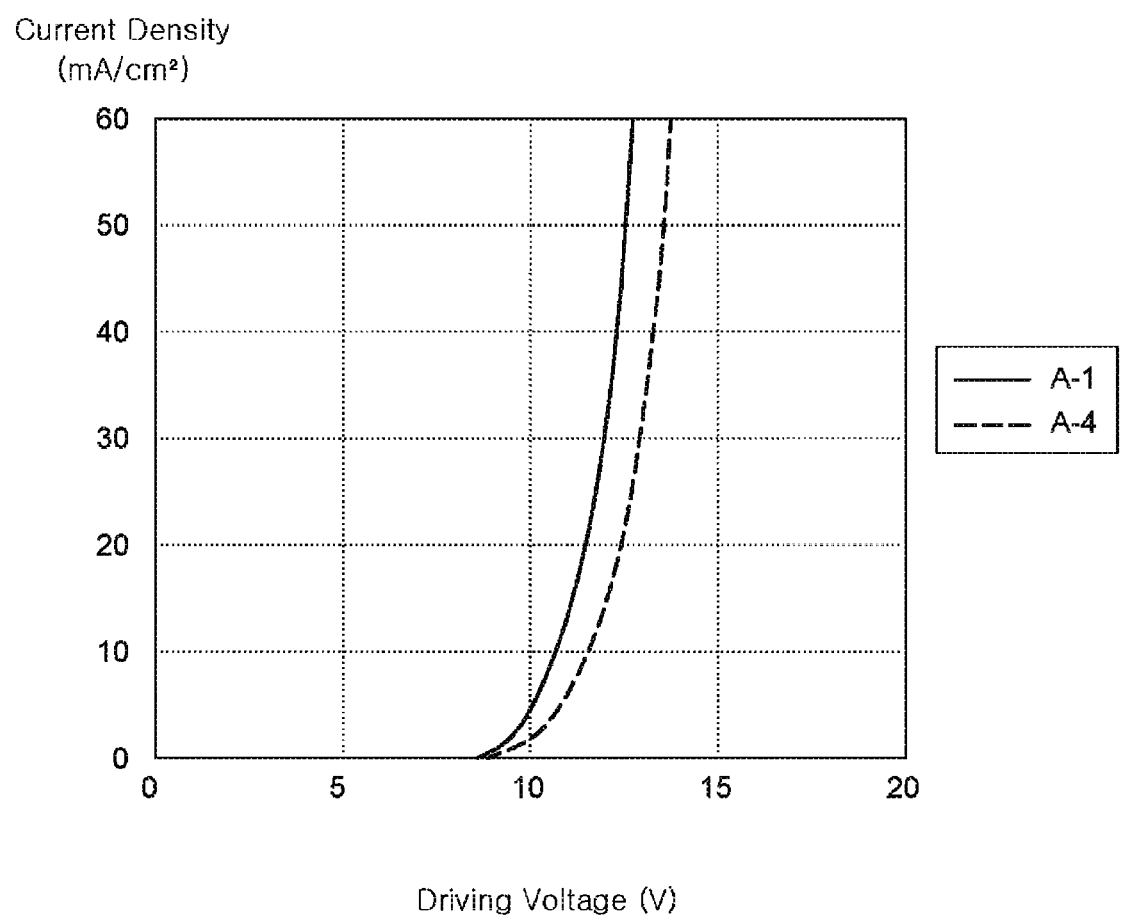
FIG. 9 is a graph showing a relationship between a current density and a driving voltage.

FIG. 9 is a graph showing a relationship between a current density and a driving voltage. A solid line is a graph corresponding to the A-1 combination element, and a dotted line is a graph corresponding to the A-4 combination element. The A-1 combination element has a lower driving voltage than the A-4 combination element on the basis of a current density. Accordingly, it can be seen that as a difference between the LUMO energy level of a P-CGL and the HOMO energy level of an HTL is increased, a driving voltage is increased.

Therefore, in order to reduce a driving voltage of the organic light emitting element 100, the organic light emitting element 100 may be configured to minimize a difference between the LUMO energy level of a P-CGL and the HOMO energy level of an HTL.

Figure 10:
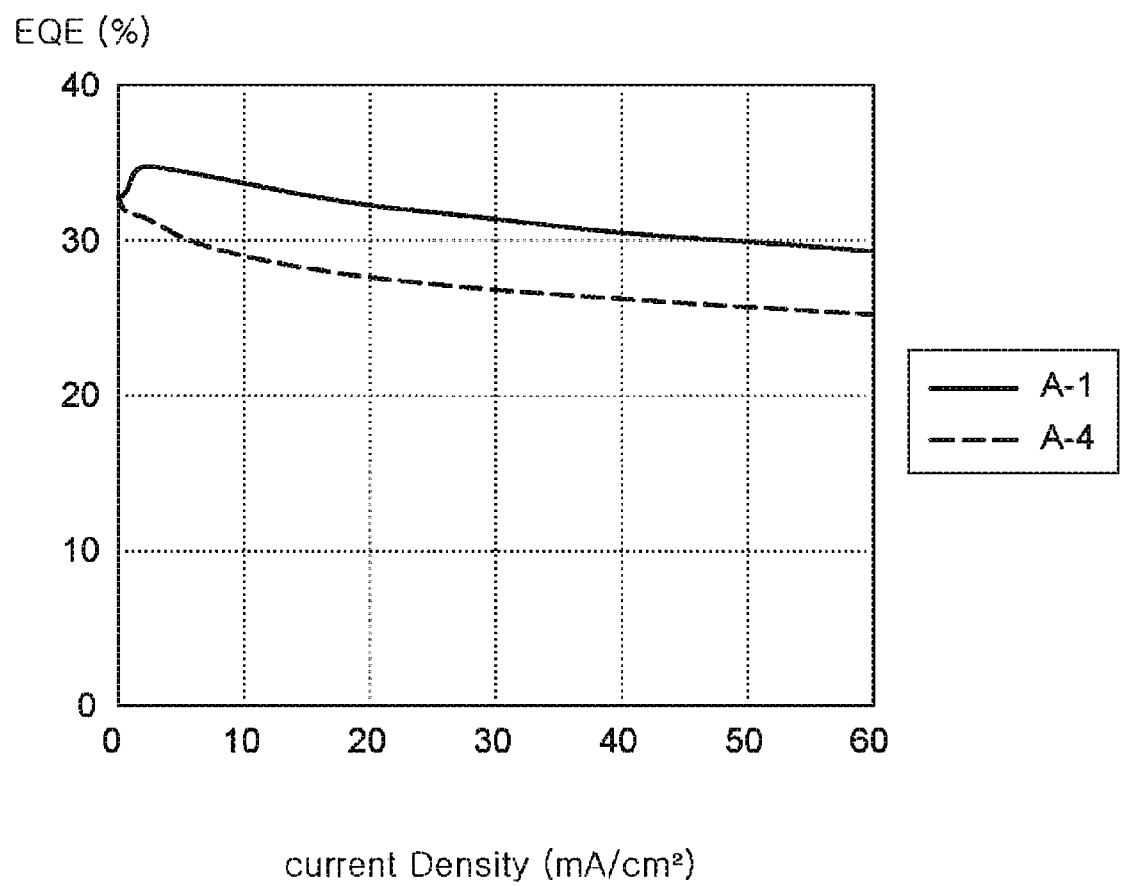
FIG. 10 is a graph showing a relationship between an external quantum efficiency and a current density.

FIG. 10 is a graph showing a relationship between an external quantum efficiency and a current density. A solid line is a graph corresponding to the A-1 combination element, and a dotted line is a graph corresponding to the A-4 combination element. The A-1 combination element has a higher external quantum efficiency than the A-4 combination element on the basis of a current density. More specifically, on average, there is a difference of about 4% between the external quantum efficiency of the A-1 combination element and the external quantum efficiency of the A-4 combination element on the basis of a current density. That is, it can be seen that as a difference between the LUMO energy level of a P-CGL and the HOMO energy level of an HTL is increased, an external quantum efficiency is decreased.

Therefore, in order to improve an external quantum efficiency of the organic light emitting element 100, the organic light emitting element 100 may be configured to minimize a difference between the LUMO energy level of a P-CGL and the HOMO energy level of an HTL.

Figure 11:
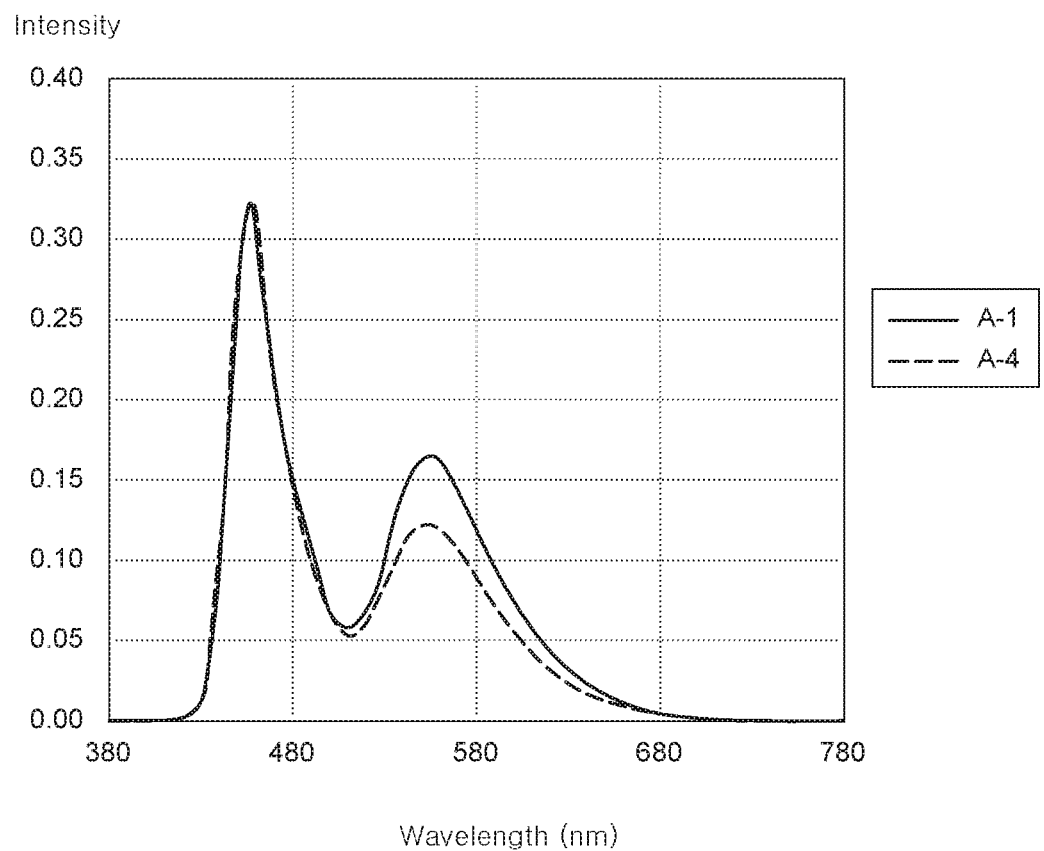
FIG. 11 is an electroluminescence spectrum (EL spectrum).

FIG. 11 is an EL spectrum. A solid line is an EL spectrum corresponding to the A-1 combination element, and a dotted line is an EL spectrum corresponding to the A-4 combination element. In the EL spectrum, an integrated value corresponds to an external quantum efficiency. The A-1 combination element has a higher integrated value in the EL spectrum than the A-4 combination element, which corresponds to the result of comparison in external quantum efficiency described with reference to FIG. 10.

Therefore, in order to improve an external quantum efficiency of the organic light emitting element 100, the organic light emitting element 100 may be configured to minimize a difference between the LUMO energy level of a P-CGL and the HOMO energy level of an HTL.

Referring to FIG. 11, as for a peak of a blue light emitted from a first or third stack emission unit, an emission wavelength range of the A-1 combination element is identical to that of the A-4 combination element. Further, as for the peak of the blue light emitted from the first or third stack emission unit, an intensity of the A-1 combination element is identical to that of the A-4 combination element. In other words, there is substantially no difference between a light emitted from a third stack emission unit of the A-1 combination element and a light emitted from a third stack emission unit of the A-1 combination element.

However, as for a peak of a yellow-green light emitted from a second stack emission unit, an emission wavelength range of the A-1 combination element is not identical to that of the A-4 combination element. Further, as for the peak of the yellow-green light emitted from the second stack emission unit, an intensity of the A-1 combination element is not identical to that of the A-4 combination element. In other words, the A-1 combination element and the A-4 combination element respectively emit yellow-green lights different in emission wavelength range and intensity. More specifically, as for the peak of the yellow-green light emitted from the second stack emission unit, the intensity of the A-1 combination element is much higher than that of the A-4 combination element. A second stack emission unit of the A-1 combination element emits a yellow-green light having a particularly high visibility to a user compared with other color lights with a high intensity. Thus, the improvement in luminous efficiency can be maximized. That is, in the A-1 combination element, an energy level of the P-CGL and an energy level of the HTL are optimized. Thus, an external quantum efficiency of a yellow-green light which is most often overlapped with the inside of a user visibility curve can be improved. Therefore, a luminous efficiency can be improved more effectively.

Referring to FIG. 2 again, the organic light emitting element 200 according to an exemplary embodiment of the present disclosure will be described.

The second CGL 250 is provided on the second stack emission unit 220. That is, the second CGL 250 is provided between the second stack emission unit 220 and the third stack emission unit 230 to be described later. The second CGL 250 is substantially the same as the first CGL 240. Therefore, details of the second CGL 250 will be omitted, and only differences between the first CGL 240 and the second CGL 250 will be described.

The second CGL 250 is disposed between the second stack emission unit 220 and the third stack emission unit 230 and supplies charges to the second stack emission unit 220 and the third stack emission unit 230. The second CGL 250 regulates a charge balance of the second stack emission unit 220 and the third stack emission unit 230.

The third stack emission unit 230 is provided on the second CGL 250.

The third stack emission unit 230 may include the third HTL 232, the third EML 234, and a third ETL 236. The third HTL 232 may include two or more layers. The third HTL 232 may be formed using two or more materials. An HIL may be further provided under the third HTL 232. The third ETL 236 may include two or more layers. the third ETL 236 may be formed using two or more materials. An EIL may be further provided on the third ETL 236.

The third HTL 232 supplies holes injected from the second CGL 250 or the HIL to the third EML 234. The third ETL 236 supplies electrons injected from the second electrode 204 or the EIL to the third EML 234. Therefore, in the third EML 234, the holes supplied through the third HTL 232 and the electrons supplied through the third ETL 236 are recombined. When excitons generated by the recombination of the holes and electrons transition from an excited state to a ground state, lights are generated.

An HBL may be further provided on the third EML 234. The HBL suppresses a transfer of holes injected into the third EML 234 to the third ETL 236 so as to improve recombination between electrons and holes within the third EML 234. Since the electrons and the holes are recombined within the third EML 234, a luminous efficiency of the third EML 234 can be improved. If the HOMO energy level of the third ETL 236 is sufficiently low, the third ETL 236 can also function as the HBL. That is, the third ETL 236 and the HBL may be formed as one layer.

An EBL may be further provided under the third EML 234. The EBL suppresses a transfer of electrons injected into the third EML 234 to the third HTL 232 so as to improve recombination between electrons and holes within the third EML 234. Since the electrons and the holes are recombined within the third EML 234, a luminous efficiency of the third EML 234 can be improved. If the LUMO energy level of the third HTL 232 is sufficiently high, the third HTL 232 can also function as the EBL. That is, the third HTL 232 and the EBL may be formed as one layer.

The third EML 234 may be configured to emit any one of blue, deep blue, and sky blue lights. The third EML 234 may have an emission wavelength range of from 440 nm to 480 nm.

The third EML 234 may include an auxiliary EML capable of emitting a light of another color except blue, deep blue, or sky blue. The auxiliary EML may include one of a yellow-green EML or a red EML, or a combination thereof. If the auxiliary EML is added to the third EML 234, a luminous efficiency of green or red light can be further improved. If the third EML 234 is configured to include the auxiliary EML, a yellow-green EML, a red EML, or a green EML may be disposed as the auxiliary EML on or under the third EML 234. Further, a yellow-green EML, a red EML, or a green EML may be disposed as the auxiliary EML on and under the third EML 234 in the same manner or different manners. A location or the number of emitting layers may be selected depending on a configuration or characteristics of the element, but is not necessarily limited thereto.

If the third EML 234 emits any one of blue, deep blue, and sky blue lights and includes an auxiliary EML capable of emitting a light of another color, the third EML 234 may have an emission wavelength range of from 440 nm to 650 nm.

If the third EML 234 may be formed of at least one host material and at least one dopant material. For example, the third EML 234 may be formed of a mixed host material including two or more host materials and at least one dopant material. As the mixed host material, both a host material having a hole transporting property and a host material having an electron transporting property may be included in the third EML 234.

The third HTL 232, the third EML 234, the third ETL 236, the EIL, the HIL, the HBL, the EBL, and the like, constituting the third stack emission unit 230 may be organic layers formed of organic materials or doped with inorganic materials.

An organic light emitting element according to various exemplary embodiments of the present disclosure may be applied to a bottom-emission type, a top-emission type, or a dual-emission type. In the top-emission type or the dual-emission type, materials of a first electrode and a second electrode or locations of various emitting layers may be changed depending on characteristics or a structure of the element.

Further, in an OLED including the organic light emitting element according to an exemplary embodiment of the present disclosure, gate lines and data lines defining respective pixel areas by intersecting with each other, and power lines extended in parallel with any one of them are disposed on the substrate 201. In each pixel area, a switching TFT connected to a gate line and a data line and a driving TFT connected to the switching TFT are disposed. The driving TFT is connected to the first electrode 202.

In the above-described exemplary embodiment, the organic light emitting element includes three stack emission units further including a stack emission unit including a blue EML on two stack emission units to improve the efficiency of blue. However, the present disclosure is not limited thereto. Therefore, the present disclosure can be applied to an organic light emitting element including two stack emission units or three or more stack emission units.

An organic light emitting element including two stack emission units will be described with reference to FIG. 3.

Figure 3:
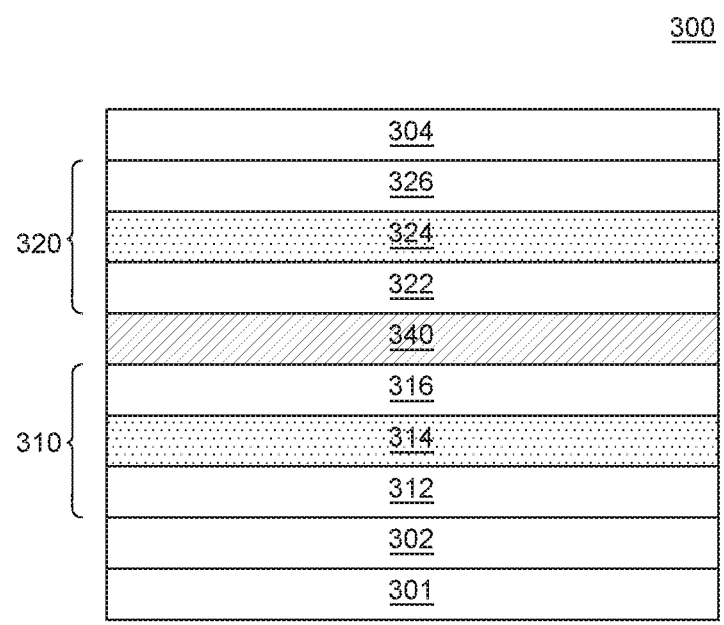

FIG. 3 is a diagram illustrating an organic light emitting element according to an exemplary embodiment of the present disclosure.

An organic light emitting element 300 illustrated in FIG. 3 includes a substrate 301, a first electrode 302, a second electrode 304, a first stack emission unit 310 between the first electrode 302 and the second electrode 304, a second stack emission unit 320, and a CGL 340 between the first stack emission unit 310 and the second stack emission unit 320. In FIG. 3, the substrate 301, the first electrode 302, the second electrode 304, the first stack emission unit 310, the second stack emission unit 320, and the CGL 340 are substantially the same as the substrate 201, the first electrode 202, the second electrode 204, the first stack emission unit 210, the second stack emission unit 220, and the first CGL 240, respectively, described with reference to FIG. 2. Therefore, detailed description of the substrate 301, the first electrode 302, the second electrode 304, the first stack emission unit 310, the second stack emission unit 320, and the CGL 340 will be omitted.

Further, in an OLED including the organic light emitting element 300 according to an exemplary embodiment of the present disclosure, gate lines and data lines defining respective pixel areas by intersecting with each other, and power lines extended in parallel with any one of them are disposed on the substrate 301. In each pixel area, a switching TFT connected to a gate line and a data line and a driving TFT connected to the switching TFT are disposed. The driving TFT is connected to the first electrode 302.

The organic light emitting elements 100, 200, and 300 according to the exemplary embodiments of the present disclosure may include at least two stack emission units 110, 210, 310, 120, 220, 320, 130, and 230 including the HTLs 112, 122, 132, 212, 222, 232, 312, and 322, the EMLs 114, 214, 314, 124, 224, 324, 134, and 234, and the ETLs 116, 126, 136, 216, 226, 236, 316, and 326. The organic light emitting elements 100, 200, and 300 according to the exemplary embodiments of the present disclosure include the CGLs 140, 150, 240, 250, and 340 between the plurality of stack emission units 110, 210, 310, 120, 220, 320, 130, and 230. Herein, at least one of the CGLs 140, 150, 240, 250, and 340 may include an N-CGL and a P-CGL which is not doped with a dopant material. The P-CGL is in direct contact with the HTLs 122, 132, 222, 232, and 322. Thus, interfaces may be formed between the P-CGL and the HTLs 122, 132, 222, 232, and 322. Herein, the P-CGL may be formed of a material which is stabilized by anionization and thus injects holes into the HTLs 122, 132, 222, 232, and 322.

That is, in the organic light emitting elements 100, 200, and 300 according to the exemplary embodiments of the present disclosure, the P-CGL is anionized, and holes are injected into the stack emission units 120, 220, 320, 130, and 230 adjacent to the P-CGL among the plurality of stack emission units 110, 210, 310, 120, 220, 320, 130, and 230.

The LUMO energy level of the P-CGL and HOMO energy levels of the HTLs 122, 132, 222, 232, and 322 are similar to each other. Specifically, a difference between the LUMO energy level of the P-CGL and the HOMO energy levels of the HTLs 122, 132, 222, 232, and 322 is smaller than a difference between an HOMO energy level of the P-CGL and HOMO energy levels of HTLs 122, 132, 222, 232, and 322. Further, a part of an energy band gap of the P-CGL may be overlapped with a part of an energy band gap of the HTLs 122, 132, 222, 232, and 322 adjacent to the P-CGL. In this case, the overlap is made since the HOMO energy level of the HTLs is lower than the LUMO energy level of the P-CGL. Further, there is an overlap of less than 0.15 eV between the energy band gap of the P-CGL and the energy band gap of the HTLs 122, 132, 222, 232, and 322 adjacent to the P-CGL.

If there is an overlap of more than 0.15 eV between the energy band gap of the P-CGL and the energy band gap of the HTLs adjacent to the P-CGL, a driving voltage of the organic light emitting element is increased sharply. In this case, the driving voltage is higher than that of an organic light emitting element including a P-CGL doped with a dopant material. Further, if there is an overlap of more than 0.15 eV between the energy band gap of the P-CGL and the energy band gap of the HTLs adjacent to the P-CGL, a luminous efficiency of the organic light emitting element is decreased sharply. In this case, the luminous efficiency is lower than that of a stack emission unit in an organic light emitting element including a P-CGL doped with a dopant material.

Figure 4:
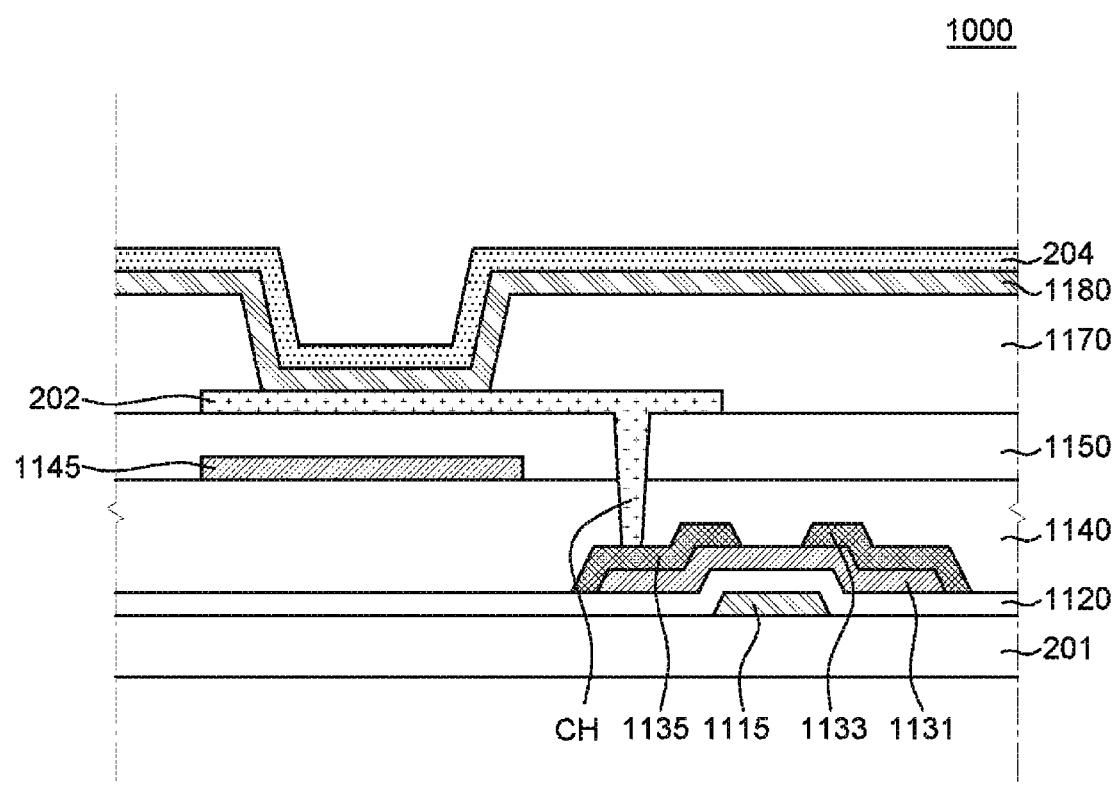
FIG. 4 is a cross-sectional view of an organic light emitting device including an organic light emitting element according to an exemplary embodiment of the present disclosure.

FIG. 4 is a cross-sectional view of an OLED including an organic light emitting element according to an exemplary embodiment of the present disclosure. FIG. 4 illustrates an organic light emitting device by applying the organic light emitting element 200 illustrated in FIG. 2, but it is just an example. The above-described organic light emitting elements 100, 200, and 300 according to various exemplary embodiments of the present disclosure can be applied thereto.

As illustrated in FIG. 4, an organic light emitting device 1000 according to an exemplary embodiment of the present disclosure includes the substrate 201, a TFT, an overcoating layer 1150, the first electrode 202, a stack emission unit 1180, and the second electrode 204. The TFT includes a gate electrode 1115, a gate insulation layer 1120, a semiconductor layer 1131, a source electrode 1133, and a drain electrode 1135.

Although FIG. 4 illustrates the TFT as having an inverted staggered structure, the TFT may be formed into a coplanar structure.

The substrate 201 may be formed of an insulation material or a material having flexibility. The substrate 201 may be formed of glass, metal, plastic, or the like, but is not limited thereto. If an OLED is a flexible OLED, the substrate 201 may be formed of a flexible material such as plastic.

The gate electrode 1115 is formed on the substrate 201 and connected to a gate line. The gate electrode 1115 may include a plurality of layers formed of any one selected from the group consisting of molybdenum (Mo), aluminum (Al), chromium (Cr), gold (Au), titanium (Ti), nickel (Ni), neodymium (Nd), and copper (Cu), or alloys thereof.

The gate insulation layer 1120 is formed on the gate electrode 1115, and may be formed as a silicon oxide film (SiOx), a silicon nitride film (SiNx), or a multilayer thereof, but is not limited thereto.

The semiconductor layer 1131 is formed on the gate insulation layer 1120. Further, the semiconductor layer 1131 may be formed of amorphous silicon (a-Si), polycrystalline silicon (poly-Si), an oxide semiconductor, an organic semiconductor, or the like. If the semiconductor layer 1131 is formed of an oxide semiconductor, the oxide semiconductor may include indium tin oxide (ITO), indium zinc oxide (IZO), or indium tin zinc oxide (ITZO), but is not limited thereto. Further, an etch stopper is formed on the semiconductor layer 1131 so as to protect the semiconductor layer 1131, but may be omitted depending on a configuration of the element.

The source electrode 1133 and the drain electrode 1135 may be formed on the semiconductor layer 1131. The source electrode 1133 and the drain electrode 1135 may be formed as a single layer or a multilayer. Further, the source electrode 1133 and the drain electrode 1135 may be formed of any one selected from the group consisting of molybdenum (Mo), aluminum (Al), chromium (Cr), gold (Au), titanium (Ti), nickel (Ni), neodymium (Nd), and copper (Cu), or alloys thereof.

A protection layer 1140 is formed on the source electrode 1133 and the drain electrode 1135, and may be formed as a silicon oxide film (SiOx), a silicon nitride film (SiNx), or a multilayer thereof. Otherwise, the protection layer 1140 may be formed of acryl-based resin, polyimide resin, and the like, but is not limited thereto.

A color layer 1145 is formed on the protection layer 1140. Although only one sub-pixel is illustrated in the drawing, the color layer 1145 is formed in a red sub-pixel area, a blue sub-pixel area, and a green sub-pixel area. The color layer 1145 includes a red (R) color filter, a green (G) color filter, and a blue (B) color filter which are deposited and patterned in the respective sub-pixels. The color layer 1145 transmits only a light having a specific wavelength among white lights emitted from the stack emission unit 1180.

The overcoating layer 1150 is formed on the color layer 1145, and may be formed of acryl-based resin or polyimide resin. Further, the overcoating layer 1150 may be formed as a silicon oxide film (SiOx), a silicon nitride film (SiNx), or a multilayer thereof, but is not limited thereto.

The first electrode 202 is formed on the overcoating layer 1150. The first electrode 202 is electrically connected to the drain electrode 1135 through a predetermined contact hole CH in the protection layer 1140 and the overcoating layer 1150. FIG. 4 illustrates that the drain electrode 1135 is electrically connected to the first electrode 202. However, the source electrode 1133 can be electrically connected to the first electrode 202 through a predetermined contact hole CH in the protection layer 1140 and the overcoating layer 1150.

A bank layer 1170 is formed on the first electrode 202 and defines a pixel area. That is, the bank layer 1170 is formed into a matrix structure at a boundary between a plurality of pixels. Thus, a pixel area is defined by the bank layer 1170. The bank layer 1170 may be formed of an organic material such as benzocyclobutene (BCB)-based resin, acryl-based resin, or polyimide resin. Otherwise, the bank layer 1170 may be formed of a photosensitizer including a black pigment. In this case, the bank layer 1170 functions as a light shielding member.

The stack emission unit 1180 is formed on the bank layer 1170. The stack emission unit 1180 may include the first stack emission unit 210, the second stack emission unit 220, and the third stack emission unit 230 illustrated in FIG. 2. The stack emission unit 1180 may include two stack emission units or three stack emission units or more as illustrated in various exemplary embodiments of the present disclosure.

The second electrode 204 is formed on the stack emission unit 1180.

An encapsulation unit may be provided on the second electrode 204. The encapsulation unit suppresses infiltration of moisture into the stack emission unit 1180. The encapsulation unit may include a plurality of layers respectively formed by laminating different inorganic materials. Otherwise, the encapsulation unit may include a plurality of layers formed by alternately laminating an inorganic material and an organic material. Further, an encapsulation substrate may be further provided on the encapsulation unit. The encapsulation substrate may be formed of glass or plastic, or may be formed of metal. The encapsulation substrate may be bonded to the encapsulation unit by an adhesive.

The exemplary embodiments of the present disclosure can also be described as follows:

According to an aspect of the present disclosure, an OLED includes: a first stack emission unit including a first hole transporting layer, a first emitting layer, and a first electron transporting layer; a second stack emission unit including a second hole transporting layer, a second emitting layer, and a second electron transporting layer; and a first charge generating layer between the first stack emission unit and the second stack emission unit. The first charge generating layer includes an N-type charge generating layer configured to inject electrons into the first stack emission unit and a P-type charge generating layer configured to inject holes into the second stack emission unit. The P-type charge generating layer and the second hole transporting layer are in direct contact with each other. A difference between a lowest unoccupied molecular orbital (LUMO) energy level of the P-type charge generating layer and a highest occupied molecular orbital (HOMO) energy level of the second hole transporting layer is smaller than a difference between an HOMO energy level of the P-type charge generating layer and the HOMO energy level of the second hole transporting layer.

The difference between the LUMO energy level of the P-type charge generating layer and the HOMO energy level of the second hole transporting layer may be smaller than ±0.15 eV.

The second hole transporting layer may supply the holes injected from the P-type charge generating layer to the second emitting layer, and the second emitting layer may be configured to emit a yellow-green light.

According to the LUMO energy level of the P-type charge generating layer, electrons may be moved from the second hole transporting layer to the P-type charge generating layer.

The P-type charge generating layer may be anionized and thus may inject holes to the second stack emission unit.

The P-type charge generating layer may not be configured as a host-dopant system.

The second stack emission unit may be configured to emit a yellow-green light.

The first stack emission unit may be configured to emit a blue light.

The organic light emitting device further includes: a third stack emission unit including a third hole transporting layer, a third emitting layer, and a third electron transporting layer; and a second charge generating layer between the second stack emission unit and the third stack emission unit. The third stack emission unit may be configured to emit a blue light.

According to another aspect of the present disclosure, an OLED includes: an organic light emitting element including at least two stack emission units each including a hole transporting layer, an emitting layer, and an electron transporting layer. At least one charge generating layer disposed between the at least two stack emission units includes an N-type charge generating layer and a P-type charge generating layer which is not doped with a dopant material. The P-type charge generating layer is configured to be anionized and thus injects holes into a stack emission unit adjacent to the P-type charge generating layer among the at least two stack emission units.

An energy band gap of the P-type charge generating layer may be overlapped with an energy band gap of the hole transporting layer included in the stack emission unit adjacent to the P-type charge generating layer.

A highest occupied molecular orbital (HOMO) energy level of the hole transporting layer is lower than a lowest unoccupied molecular orbital (LUMO) energy level of the P-type charge generating layer, and the LUMO energy level of the P-type charge generating layer may be overlapped with the HOMO energy level of the hole transporting layer in the range of less than 0.15 eV.

A difference between an absolute value of a lowest unoccupied molecular orbital (LUMO) energy level of the P-type charge generating layer and an absolute value of a highest occupied molecular orbital (HOMO) energy level of a layer included in the stack emission unit and directly injected with the holes from the P-type charge generating layer may be less than 0.15 eV.

As described herein, embodiments in accordance with the present disclosure may provide an OLED including an organic light emitting element with excellent color coordinates, luminous efficiency and driving voltage.

In the OLED according to an exemplary embodiment of the present disclosure, a red organic emitting layer including an electron-transporting host material and a yellow-green organic emitting layer including a plurality of host materials are disposed together in a single stack emission unit. Herein, an additional host material is not used for an organic emitting layer. Instead, materials constituting an electron transporting layer and a hole transporting layer are used as host materials of the red organic emitting layer and the yellow-green organic emitting layer. Therefore, the number of materials constituting the organic light emitting element can be reduced. Thus, a manufacturing process can be simplified. Further, it is possible to realize an organic light emitting element having excellent color gamut, luminous efficiency, and lifetime.

According to the exemplary embodiments of the present disclosure, it is possible to provide an OLED including an organic light emitting element. In the OLED, an emitting layer disposed in a stack emission unit, which is not in direct contact with a first electrode but separated therefrom, has a high luminous efficiency.

According to the exemplary embodiments of the present disclosure, it is possible to provide an OLED including an organic light emitting element. The OLED has a more simple structure since a P-type charge generating layer included in a charge generating layer is not configured as a host-dopant system.

According to the exemplary embodiments of the present disclosure, it is possible to provide an OLED including an organic light emitting element. In the OLED, a P-type charge generating layer included in a charge generating layer has a low LUMO energy level, and, thus, holes are injected into a stack emission unit in an anionized and stable manner.

According to the exemplary embodiments of the present disclosure, it is possible to provide an OLED including an organic light emitting element. In the OLED, a high-priced dopant material is not used in a charge generating layer, and an energy level of the charge generating layer and an energy level of a hole transporting layer has an optimized relationship. Thus, the OLED has excellent electro-optical characteristics.

According to the exemplary embodiments of the present disclosure, it is possible to provide an OLED including an organic light emitting element. The OLED has a simple structure with excellent color gamut, luminous efficiency and driving voltage, and, thus, a manufacturing process is simplified. Therefore, the yield can be improved.

It will be apparent to those skilled in the art that various modifications and variations can be made in the organic light emitting device of the present invention without departing from the spirit or scope of the invention. Thus, it is intended that the present invention cover the modifications and variations of this invention provided they come within the scope of the appended claims and their equivalents.

What is claimed is:

1. An organic light emitting device comprising:
    a first stack emission unit including a first hole transporting layer, a first emitting layer, and a first electron transporting layer;
    a second stack emission unit including a second hole transporting layer, a second emitting layer, and a second electron transporting layer; and
    a first charge generating layer between the first stack emission unit and the second stack emission unit,
    wherein the first charge generating layer includes an N-type charge generating layer configured to inject electrons into the first stack emission unit and a P-type charge generating layer configured to inject holes into the second stack emission unit,
    the P-type charge generating layer and the second hole transporting layer are in direct contact with each other, and
    a difference between a lowest unoccupied molecular orbital (LUMO) energy level of the P-type charge generating layer and a highest occupied molecular orbital (HOMO) energy level of the second hole transporting layer is smaller than a difference between a HOMO energy level of the P-type charge generating layer and the HOMO energy level of the second hole transporting layer,
    wherein the second hole transporting layer is formed of a material having a lower hole mobility than the first hole transporting layer.

2. The organic light emitting device according to claim 1, wherein the difference between the LUMO energy level of the P-type charge generating layer and the HOMO energy level of the second hole transporting layer is smaller than ±0.15 eV.

3. The organic light emitting device according to claim 1, wherein the second hole transporting layer is configured to supply the holes injected from the P-type charge generating layer to the second emitting layer, and
the second emitting layer is configured to emit a yellow-green light.

4. The organic light emitting device according to claim 1, wherein according to the LUMO energy level of the P-type charge generating layer, electrons are moved from the second hole transporting layer to the P-type charge generating layer.

5. The organic light emitting device according to claim 4, wherein the P-type charge generating layer is anionized and thus injects holes to the second stack emission unit.

6. The organic light emitting device according to claim 1, wherein the P-type charge generating layer is not configured as a host-dopant system.

7. The organic light emitting device according to claim 1, wherein the second stack emission unit is configured to emit a yellow-green light.

8. The organic light emitting device according to claim 7, wherein the first stack emission unit is configured to emit a blue light.

9. The organic light emitting device according to claim 7, further comprising:
a third stack emission unit including a third hole transporting layer, a third emitting layer, and a third electron transporting layer; and
a second charge generating layer between the second stack emission unit and the third stack emission unit,
wherein the third stack emission unit is configured to emit a blue light.

10. An organic light emitting device comprising: an organic light emitting element including at least two stack emission units each including a hole transporting layer, an emitting layer, and an electron transporting layer,
wherein at least one charge generating layer disposed between the at least two stack emission units includes an N-type charge generating layer and a P-type charge generating layer which is not doped with a dopant material, and
the P-type charge generating layer is configured to be anionized and thus injects holes into a stack emission unit adjacent to the P-type charge generating layer among the at least two stack emission units,
wherein a hole transporting layer of one stack emission unit adjacent to the P-type charge generating layer is formed of a material having a lower hole mobility than a hole transporting layer of another stack emission unit adjacent to the N-type charge generating layer.

11. The organic light emitting device according to claim 10, wherein an energy band gap of the P-type charge generating layer is overlapped with an energy band gap of the hole transporting layer included in the stack emission unit adjacent to the P-type charge generating layer.

12. The organic light emitting device according to claim 11, wherein a highest occupied molecular orbital (HOMO) energy level of the hole transporting layer is lower than a lowest unoccupied molecular orbital (LUMO) energy level of the P-type charge generating layer, and
the LUMO energy level of the P-type charge generating layer is overlapped with the HOMO energy level of the hole transporting layer in the range of less than 0.15 eV.

13. The organic light emitting device according to claim 10, wherein a difference between an absolute value of a lowest unoccupied molecular orbital (LUMO) energy level of the P-type charge generating layer and an absolute value of a highest occupied molecular orbital (HOMO) energy level of a layer included in the stack emission unit and directly injected with the holes from the P-type charge generating layer is less than 0.15 eV.

14. The organic light emitting device according to claim 1, wherein an energy band gap of the P-type charge generating layer is overlapped with an energy band gap of the second hole transporting layer.

15. The organic light emitting device according to claim 1, wherein the material of the first hole transporting layer has a hole mobility between $5.0 \cdot 10^{-5}$ cm$^2$/Vs and $9.0 \cdot 10^{-4}$ cm$^2$/Vs.

16. The organic light emitting device according to claim 1, wherein the material of the second hole transporting layer has a hole mobility between $5.0 \cdot 10^{-6}$ cm$^2$/Vs and $9.0 \cdot 10^{-5}$ cm$^2$/Vs.

* * * * *